US008860519B2

(12) United States Patent
Ribeiro et al.

(10) Patent No.: US 8,860,519 B2
(45) Date of Patent: Oct. 14, 2014

(54) DEVICE HAVING INDUCTOR AND MEMCAPACITOR

(75) Inventors: Gilberto Medeiros Ribeiro, Menlo Park, CA (US); John Paul Strachan, Stanford, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 197 days.

(21) Appl. No.: 13/388,440

(22) PCT Filed: Oct. 15, 2009

(86) PCT No.: PCT/US2009/060854
§ 371 (c)(1),
(2), (4) Date: Feb. 1, 2012

(87) PCT Pub. No.: WO2011/046555
PCT Pub. Date: Apr. 21, 2011

(65) Prior Publication Data
US 2012/0146739 A1    Jun. 14, 2012

(51) Int. Cl.
*H03B 5/12* (2006.01)
*H01L 23/64* (2006.01)
*H03J 3/20* (2006.01)
*H03J 3/18* (2006.01)

(52) U.S. Cl.
CPC ........ *H03B 5/124* (2013.01); *H03B 2201/0208* (2013.01); *H01L 23/642* (2013.01); *H03J 3/18* (2013.01); *H03J 3/20* (2013.01)
USPC .................. 331/167; 331/117 R; 331/177 V; 334/15; 257/532

(58) Field of Classification Search
USPC ....... 331/117 R, 117 FE, 167, 177 R; 334/11, 334/14, 15, 78; 257/532
See application file for complete search history.

(56) References Cited

U.S. PATENT DOCUMENTS

| | | | |
|---|---|---|---|
| 7,031,136 B2 | 4/2006 | Hunt et al. | |
| 8,493,138 B2 * | 7/2013 | Strachan et al. | 327/554 |
| 2005/0239262 A1 * | 10/2005 | Zhuang et al. | 438/385 |
| 2008/0001172 A1 | 1/2008 | Karg et al. | |
| 2012/0039114 A1 * | 2/2012 | Bratkovski et al. | 365/149 |
| 2012/0146184 A1 * | 6/2012 | Pickett et al. | 257/532 |

OTHER PUBLICATIONS

Di Ventra et al., "Circuit elements with memory: memristors, memcapacitors and meminductors", 2009. arXiv:0901.3682.*
Di Ventra et al., "Putting Memory Into Circuit Elements: Memristors, Memcapacitors, and Meminductors [Point of View]." Proceedings of the IEEE 97.8 (2009): 1371-1372.*

* cited by examiner

*Primary Examiner* — Ryan Johnson

(57) ABSTRACT

Methods and means related to an electronic circuit having an inductor and a memcapacitor are provided. Circuitry is formed upon a substrate such that an inductor and non-volatile memory capacitor are formed. Additional circuitry can be optionally formed on the substrate as well. The capacitive value of the memcapacitor is adjustable within a range by way of an applied programming voltage. The capacitive value of the memcapacitor is maintained until reprogrammed at some later time. Oscillators, phase-locked loops and other circuits can be configured using embodiments of the present teachings.

20 Claims, 4 Drawing Sheets

DEVICE HAVING INDUCTOR AND MEMCAPACITOR

BACKGROUND

Numerous electronic devices use tuned circuits configured to operate at a resonant frequency. One well known configuration is referred to as a "tank circuit" and includes a capacitor and an inductor coupled in an electrically parallel arrangement. Each tank circuit is characterized by a resonant frequency that is a fixed value, unless one or both of the capacitive and inductive values are variable. Variability of the capacitor, inductor or both yields a variable frequency tank circuit.

Various forms of variable capacitor and variable inductor have been devised. However, classical known embodiments of such variable devices are too bulky, require mechanical adjustment, require continuous direct-current biasing or have other characteristics that render them undesirable for modern circuit design. Other known varieties of variable capacitor and variable inductor exhibit other unsuitable qualities. The present teachings address the foregoing concerns.

BRIEF DESCRIPTION OF THE DRAWINGS

The present embodiments will now be described, by way of example, with reference to the accompanying drawings, in which.

DETAILED DESCRIPTION

Introduction

Means and methods related to resonant circuits are provided by the present teachings. Circuitry is formed upon a substrate such that an inductor and non-volatile memory capacitor (i.e., memcapacitor) are formed. Additional circuitry, such as that presented by the present teachings, can be optionally formed on the substrate as well. The capacitive value of the memcapacitor is adjustable within a range by way of an applied programming voltage. The capacitive value of the memcapacitor is maintained until reprogrammed at some later time. Oscillators, phase-locked loops and other circuits can be configured using embodiments of the present teachings.

In one embodiment, an apparatus includes a ground plane defining a first capacitive plate. The apparatus also includes a dielectric layer overlying the ground plane. The apparatus also includes mobile dopants that are repositionable within the dielectric layer under the influence of an electric field. The apparatus further includes a metallic layer overlying the dielectric layer. The metallic layer is configured to define a second capacitive plate and an inductor. The first capacitive plate and the second capacitive plate and the dielectric layer are respective portions of a capacitor.

In another embodiment, an electronic circuit includes a memcapacitor. The memcapacitor is characterized by a non-volatile capacitance value adjustable in response to a programming voltage. The memcapacitor includes a capacitive plate. The electronic circuit also includes an inductor electrically coupled to the memcapacitor. The capacitive plate and the inductor are respective portions of a continuous electrically conductive mass.

In another embodiment, a method includes applying a programming voltage to a memcapacitor. The method also includes adjusting a capacitance value of the memcapacitor in response to the applied programming voltage. The method further includes operating the memcapacitor at a new resonant frequency distinct from a previous resonant frequency by virtue of the adjusted capacitance value.

First Illustrative Embodiment

Figure 1A:
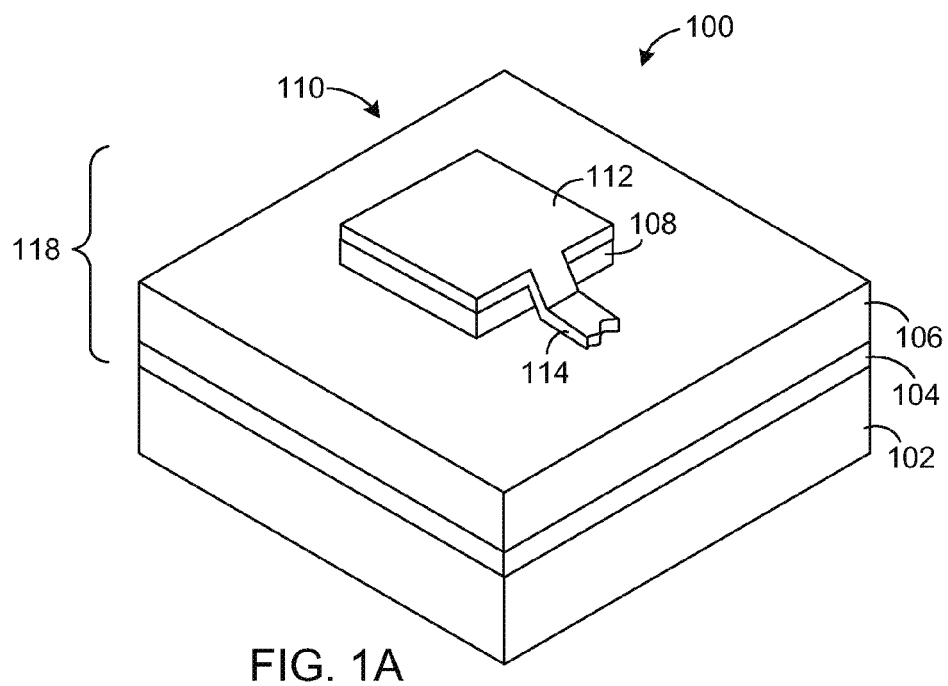
FIG. 1A depicts an isometric view of an electronic device according to one embodiment.

Reference is now directed to FIG. 1A, which depicts an isometric view of an electronic device 100. The electronic device 100 is illustrative and non-limiting with respect to the present teachings. Thus, other electronic devices can be configured and/or operated in accordance with the present teachings.

The electronic device 100 includes a substrate 102. The substrate 102 can be formed from silicon dioxide ($SiO_2$) or other suitable electrically non-conductive material. In one embodiment, the substrate 102 is defined by a doped or undoped silicon wafer (or portion thereof) and supports other electronic circuitry (not shown) formed thereon. Other illustrative and non-limiting materials are cited on Table 1 below.

The electronic device 100 also includes an electrically conductive layer 104 formed upon or otherwise applied to the substrate 102. The electrically conductive layer can be defined by or include aluminum, platinum, gold, etc. Other suitable electrically conductive materials can also be used. The electrically conductive layer 104 is also referred to herein as a ground plane. The ground plane 104, in whole or in part, defines a capacitive plate as described in greater detail hereinafter.

The electronic device 100 also includes a dielectric layer 106 formed upon or otherwise applied to the ground plane 104. The dielectric layer 106 can be formed from titanium dioxide ($TiO_2$) or another suitable material. In one embodiment, the dielectric layer 106 has a relative permittivity ($\in_r$) of forty. Other materials having other relative permittivity's can also be used.

The electronic device 100 also includes a donor layer 108 formed upon or otherwise applied to the dielectric layer 106. The donor layer 108 includes material selected to provide mobile dopants to, and to receive those mobile dopants from, the dielectric layer 106 under the influence of an electric field. In one illustrative and non-limiting embodiment, the donor layer 108 is formed from or includes titanium dioxide with oxygen vacancies, $TiO_x$, wherein x is in the range of zero to zero-point-five. In another embodiment, the donor layer 108 is formed from a silicon matrix including lithium ions. Other materials having other dopants (ions) which can be forcibly migrated under electric field influence can also be used. Table 1 below recites illustrative and non-limiting examples of compatible dielectric layer 106 and corresponding donor layer 108 materials:

TABLE 1

Compatible Materials Listing

| Dielectric 106 | Donor 108 | Dopant Species |
|---|---|---|
| Si | Lithium Doped Si | Lithium Ions |
| Si | Si:Ag | Silver Ions |
| $TiO_2$ | $TiO_{2-x}$ | Oxygen Vacancies |
| $ZrO_2$ | $ZrO_{2-x}$ | Oxygen Vacancies |
| $HfO_2$ | $HfO_{2-x}$ | Oxygen Vacancies |
| $SrTiO_3$ | $SrTiO_{3-x}$ | Oxygen Vacancies |
| GaN | $GaN_{1-x}$ | Nitrogen Vacancies |
| CuCl | $CuCl_{1-x}$ | Chlorine Vacancies |
| GaN | GaN:S | Sulfide Ions |
| $SiO_2$ | Na | Sodium Ions |

Figure 1B:
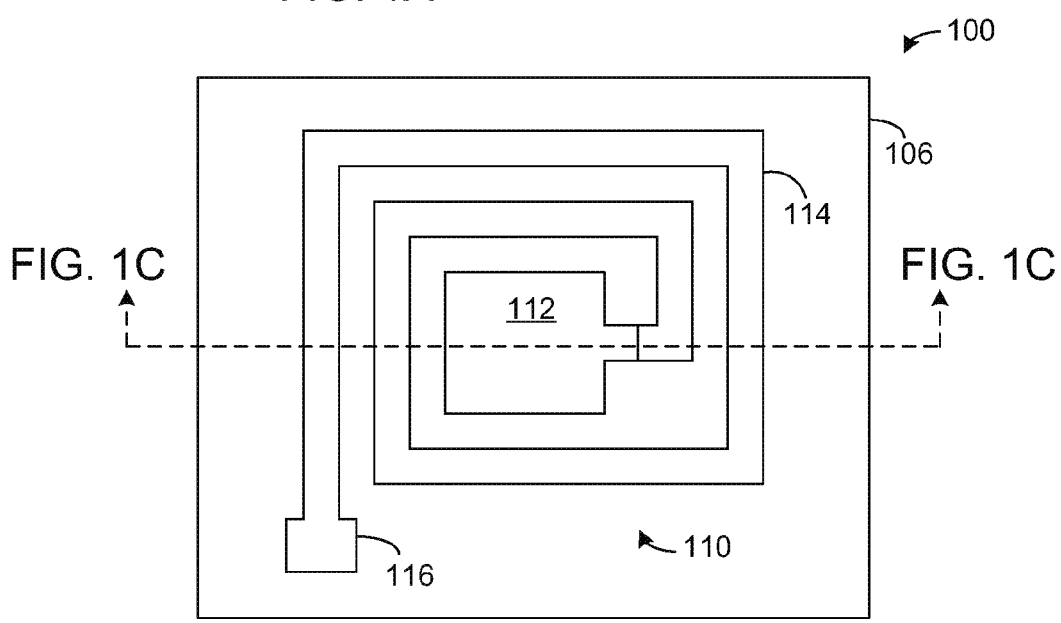
FIG. 1B is a plan view depicting the electronic device of FIG. 1A.

The electronic device 100 further includes a metallic layer 110. The metallic layer 110 can be formed from aluminum, platinum, gold, etc. Other metallic, electrically conductive materials can also be used. The metallic layer 110 defines a capacitive plate 112 and an inductor 114. It is noted that a relatively small portion of the inductor 114 is shown in FIG. 1A in the interest of clarity. Reference is also made to FIG. 1B. The metallic layer 110 is formed as a continuous electrically-conductive mass such that the capacitive plate 112 and the inductor 114 are respective portions thereof. Additionally, the capacitive plate 112 and the donor layer 108 and the dielectric layer 106 and the ground plane 104 collectively define a memcapacitor (i.e., programmable, non-volatile capacitor 118, which is described in further detail hereinafter. The inductor 114 and the memcapacitor 118 are electrically coupled by virtue of the continuous nature of the metallic layer 110.

Reference is now made to FIG. 1B, which depicts a plan view of the electronic device 100. The inductor 114 defines a spiral form about the capacitive plate 112. Thus, the inductor 114 can also be referred to as a spiral inductor. Furthermore, the metallic layer 110 is formed to define an electrical contact pad 116. The electrical contact pad 116 is also referred to herein as an inductive end node. It is noted that the capacitive plate 112 is formed over or applied to the donor layer 108, while the inductor 114 is formed over or applied to the dielectric layer 106. In turn, the substrate 102 supports the ground plane 104 and the dielectric layer 106 and the donor layer 108 and the metallic layer 110.

Figure 1C:
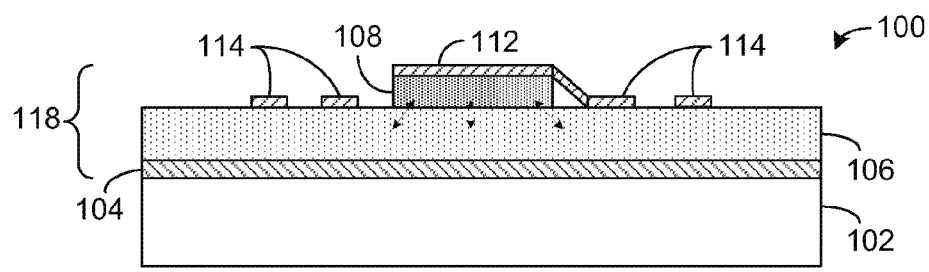
FIG. 1C is an elevation section view depicting the electronic device of FIG. 1A.

FIG. 10 depicts a section elevation view of the electronic device 100. The layered form of the memcapacitor 118 is readily depicted in the FIG. 1C.

Normal characteristics and operation of the electronic device 100 are as follows: the inductor 114 is defined (i.e., characterized) by an inductive value in Henries. In one embodiment, the inductor 114 has an inductive value of one micro-Henry ($1 \times 10^{-6}$ Henries). Other inductive values are also possible. In turn, the memcapacitor 118 is characterized by an original or "native state" capacitive value in Farads. In one embodiment, the memcapacitor 118 has a native state capacitive value of about three femtoFarads ($3.0 \times 10^{-15}$ Farads). Other native state capacitive values are also possible. The memcapacitor 118 is referred to as having a native state because the capacitive value thereof is adjustable.

The memcapacitor 118 and the inductor 114 operate as respective elements in an electronic circuit. In one embodiment, the memcapacitor 118 and the inductor 114 are electrically coupled to define a tank circuit, optionally as part of an oscillator. Other circuits including the memcapacitor 118 and the inductor 114 are also possible. Additionally, the memcapacitor 118 is configured to be adjustable with respect to its capacitive value. Adjustment is made by application of a direct-current potential or "programming voltage" to the ground plane 104 and the capacitive plate 112. Such adjustment of the capacitive value is non-volatile and is maintained after cessation of the programming voltage.

The programming voltage is typically applied to the memcapacitor 118 in the form of an electrical pulse, the polarity of which determines whether the capacitive value will be increased or decreased. Additionally, the magnitude and duration (i.e., total energy) of the applied programming voltage—that is, the resulting electric field—are directly related to the shift in capacitive value that is achieved, within the performance limits of the memcapacitor 118.

For purposes of non-limiting example, a programming voltage of twenty volts DC (e.g., $10^7$ Volts/Centimeter applied field strength, etc.) is applied to the memcapacitor 118 for ten milliseconds, with the positive pole connected to the capacitive plate 112 and the negative pole connected to the ground plane 104. As such, positive dopants (e.g., oxygen vacancies) are forcibly migrated (i.e., repositioned) from the donor layer 108 and into the dielectric layer 106. In this example, the capacitive value of the memcapacitor 118 is decreased due to a decrease in the dielectric constant of the dielectric layer 106. One having ordinary skill in the electrical and related arts will appreciate that such a result is consistent with Equation 1 below:

$$C = \epsilon_r \epsilon_0 A/d \quad \text{(Equation 1)}$$

where:
C is the capacitive value in Farads;
$\epsilon_r$ is the relative permittivity of the dielectric;
$\epsilon_0$ is the permittivity of free space in Farads/meter;
A is the area of the capacitive plate in meters$^2$; and
d is the thickness of the dielectric layer in meters.

For purposes of another non-limiting example, it is now assumed that a programming voltage of fifteen volts DC is applied to the memcapacitor 118 for ten milliseconds, with the negative pole connected to the capacitive plate 112 and the positive pole connected to the ground plane 104. As such, positive dopants are repositioned generally from the dielectric layer 106 back into the donor layer 108. In this example, the capacitive value of the memcapacitor 118 is increased due to an increase in the dielectric constant of the dielectric layer 106.

Typical normal operations of the electronic device 100 are performed in the alternating-current domain so as to preserve the programmed value of the memcapacitor 118—operation in the DC domain can result in drift or unintentional "reprogramming" of the memcapacitor 118 value. In one embodiment, the inductor 114 and the memcapacitor 118 are coupled so as to define a tank circuit having a resonant frequency of about three-point-zero gigahertz ($3 \times 10^9$ Hertz).

Table 2 below summarizes illustrative and non-limiting characteristics and parameters for the electronic device 100 (i.e., 1 μm=$1 \times 10^{-6}$ meters; 1 nm=$1 \times 10^{-9}$ meters):

TABLE 2

Illustrative Electronic Device 100

| Feature | Length × Width × Thickness | Notes/Other |
|---|---|---|
| Substrate 102 | 3.0 μm × 3.0 μm × 500 μm | Silicon wafer |
| Ground Plane 104 | 3.0 μm × 3.0 μm × 10.0 nm | Platinum |

TABLE 2-continued

Illustrative Electronic Device 100

| Feature | Length × Width × Thickness | Notes/Other |
|---|---|---|
| Dielectric 106 | 3.0 μm × 3.0 μm × 30.0 nm | $TiO_2$; $\epsilon_r = 40$ |
| Donor Layer 108 | 0.5 μm × 0.5 μm × 20.0 nm | $TiO_{2-X}$ |
| Cap. Plate 112 | 0.5 μm × 0.5 μm × 10.0 nm | Platinum |
| Inductor 114 | Total trace length = 110 μm | Platinum |

Second Illustrative Embodiment

Figure 2A:
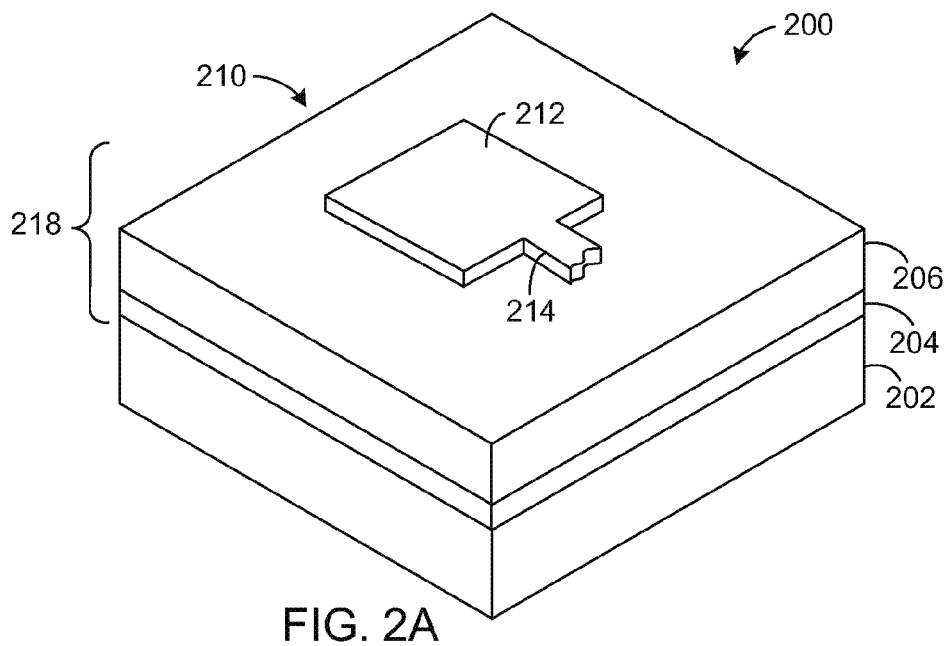
FIG. 2A depicts an isometric view of an electronic device according to another embodiment.
Figure 2B:
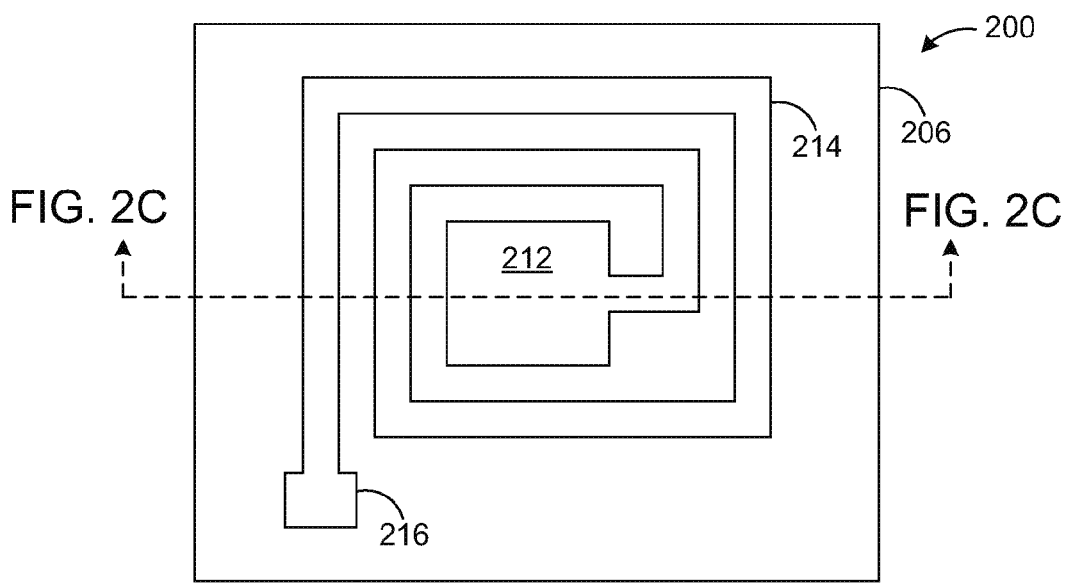
FIG. 2B is a plan view depicting the electronic device of FIG. 2A.
Figure 2C:
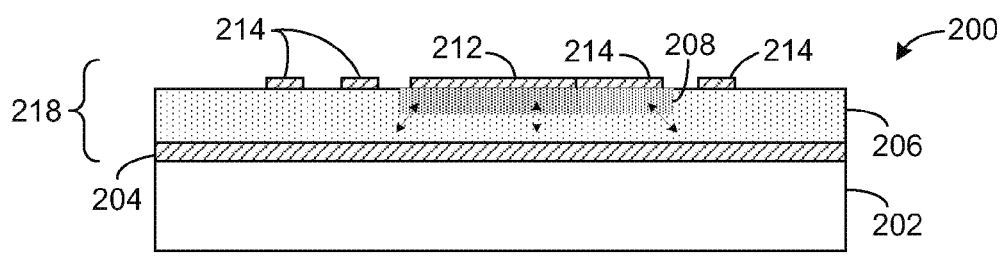
FIG. 2C is an elevation section view depicting the electronic device of FIG. 2A.

Reference is now directed to FIG. 2A, which depicts an isometric view of an electronic device 200. The electronic device 200 is illustrative and non-limiting with respect to the present teachings. Thus, other electronic devices can be configured and/or operated in accordance with the present teachings. Simultaneous reference is also made to FIG. 2B, which depicts a plan view of the electronic device 200, and FIG. 2C, which depicts an elevation section view of the electronic device 200.

The electronic device 200 includes a substrate 202. The substrate 202 can be formed from silicon dioxide ($SiO_2$) or another suitable electrically non-conductive material. In one embodiment, the substrate 202 is defined by a doped or undoped silicon wafer (or portion thereof) and supports other electronic circuitry (not shown) formed thereon.

The electronic device 200 also includes an electrically conductive layer 204 formed upon or otherwise applied to the substrate 202. The electrically conductive layer can be defined by or include aluminum, platinum, gold, etc. Other suitable electrically conductive materials can also be used. The electrically conductive layer 204 is also referred to herein as a ground plane. The ground plane 204, in whole or in part, defines a capacitive plate as described in greater detail hereinafter.

The electronic device 200 also includes a dielectric layer 206 formed upon or otherwise applied to the ground plane 204. The dielectric layer 206 can be formed from a high-resistivity semiconductor matrix, a polymer material, or another suitable material that is doped or can be modified to include mobile dopants. In one embodiment, the dielectric layer 206 is formed of high-resistivity silicon. The dielectric layer 206 is characterized by a relative permittivity generally as described above. The dielectric layer 206 includes doped region 208. Thus, the doped region 208 is a portion of the dielectric layer 206. In one embodiment, the doped region 208 includes lithium ions. Other suitable dopants can also be used.

The electronic device 200 further includes a metallic layer 210. The metallic layer 210 can be formed from aluminum, platinum, gold, etc. Other metallic, electrically conductive materials can also be used. The metallic layer 210 defines a capacitive plate 212 and an inductor 214. It is noted that a relatively small portion of the inductor 214 is shown in FIG. 2A in the interest of clarity. The metallic layer 210 is formed as a continuous electrically-conductive mass such that the capacitive plate 212 and the inductor 214 are respective portions thereof. Additionally, the capacitive plate 212 and the dielectric layer 206 and the ground plane 204 collectively define a memcapacitor (i.e., programmable, non-volatile capacitor) 218. The inductor 214 and the memcapacitor 218 are electrically coupled by virtue of the continuous nature of the metallic layer 210.

Normal characteristics and operation of the electronic device 200 are as follows: the inductor 214 is characterized by an inductive value in Henries as described above. In turn, the memcapacitor 218 is characterized by a native state capacitive value in Farads. The memcapacitor 218 and the inductor 214 operate as respective elements in an electronic circuit. In one embodiment, the memcapacitor 218 and the inductor 214 are electrically coupled to define a tank circuit, optionally as part of an oscillator. Other circuits including the memcapacitor 218 and the inductor 214 are also possible.

The memcapacitor 218 is configured to be adjustable with respect to its capacitive value as described above. Thus, adjustment is made by application of a DC programming voltage to the ground plane 204 and the capacitive plate 212. Such adjustment of the capacitive value is non-volatile and is maintained after cessation of the programming voltage.

For purposes of non-limiting example, a programming voltage of twenty volts DC is applied to the memcapacitor 218 for ten milliseconds, with the positive pole connected to the capacitive plate 212 and the negative pole connected to the ground plane 204. As such, positive dopants (e.g., lithium ions) are repositioned from the doped region 208 and dispersed into the surrounding portion of the dielectric layer 206. In this example, the capacitive value of the memcapacitor 218 is decreased due to a decrease in the dielectric constant of the dielectric layer 206.

For purposes of another non-limiting example, it is now assumed that a programming voltage of fifteen volts DC is applied to the memcapacitor 218 for ten milliseconds, with the negative pole connected to the capacitive plate 212 and the positive pole connected to the ground plane 204. As such, positive dopants are repositioned (migrated) from the surrounding dielectric layer 206 back toward (i.e., re-concentrated within) the doped region 208. In this example, the capacitive value of the memcapacitor 218 is increased due to an increase in the dielectric constant of the dielectric layer 206. Typical normal operations of the electronic device 200 are performed in the alternating-current domain as described above.

Table 3 below summarizes illustrative and non-limiting characteristics and parameters for the electronic device 200 (i.e., 1 μm=$1\times10^{-6}$ meters; 1 nm=$1\times10^{-9}$ meters):

TABLE 3

Illustrative Electronic Device 200

| Feature | Length × Width × Thickness | Notes/Other |
|---|---|---|
| Substrate 202 | 3.0 μm × 3.0 μm × 40.0 nm | Doped Si Wafer |
| Ground Plane 204 | 3.0 μm × 3.0 μm × 10.0 nm | Platinum |
| Dielectric 206 | 3.0 μm × 3.0 μm × 30.0 nm | Hi-Ω Si; $\epsilon_r = 11$ |
| Doped Region 208 | 0.6 μm × 0.6 μm × 10.0 nm | Lithium Ions |
| Cap. Plate 212 | 0.5 μm × 0.5 μm × 10.0 nm | Platinum |
| Inductor 214 | Total trace length = 110 μm | Platinum |

First Illustrative Circuit

Figure 3:
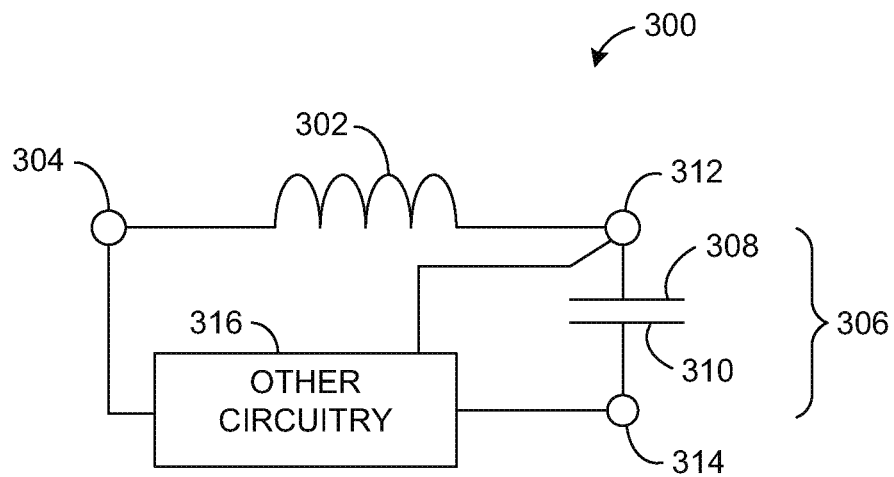
FIG. 3 depicts a schematic view of a circuit according to one embodiment.

FIG. 3 depicts a schematic view of a circuit 300 according to one embodiment. The circuit 300 is illustrative and non-limiting with respect to the present teachings. Other circuits are also contemplated by the present teachings.

The circuit 300 includes an inductor 302. The inductor 302 can be defined by any inductor consistent with the present teachings (e.g., 114, 214, etc.). The inductor 302 includes an end node 304. The circuit 300 also includes a memcapacitor 306. The memcapacitor 306 can be defined by any memcapacitor consistent with the present teachings (e.g., 118, 218, etc.). The memcapacitor 306 includes a top capacitive plate 308 and the bottom capacitive plate 310. The top capacitive plate 306 also defines a top node 312, while the bottom capacitive plate also defined a bottom node 314.

The circuit 300 also includes other circuitry 316. The other circuitry 316 is electrically coupled to the end node 304, the top node 312 and the bottom node 314. The other circuitry 316 can be defined or include any suitable electronic circuitry for use with the inductor 302 and memcapacitor 306. For non-limiting example, the other circuitry can be defined by or as a portion of a wireless network hub, a cellular telephone, a computer, a radio-frequency identification device (RFID), a two-way radio, etc. As depicted, the other circuitry 316 includes a mixer 318 and a reference frequency oscillator 320. Other resources or features can also be included.

In one embodiment, the other circuitry 316 is coupled to the respective nodes 304, 312 and 314 such that an oscillator having a resonant tank circuit is defined. Other circuits are also possible. Additionally, the other circuitry 316 can be configured such that programming voltages can be applied to the memcapacitor 306 by way of the top node 312 and the bottom node 314.

First Illustrative Method

Figure 4:
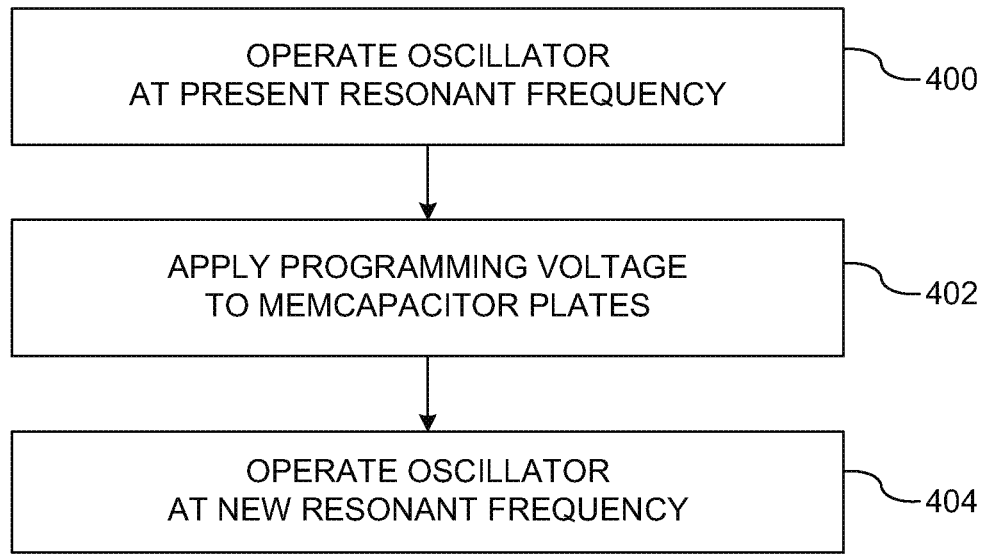
FIG. 4 is a flow diagram of a method according to one embodiment.

Attention is now directed to FIG. 4, which depicts a method according to one embodiment of the present teachings. The method of FIG. 4 depicts particular method steps and an order of execution. However, it is to be understood that other methods including other steps, omitting one or more of the depicted steps, or proceeding in other orders of execution are also contemplated. Thus, the method of FIG. 4 is illustrative and non-limiting with respect to the present teachings. Reference is made to FIG. 3 in the interest of understanding the method of FIG. 4.

At 400, an oscillator is operated at its present resonant frequency. For purposes of non-limiting illustration, it is assumed that the inductor 302, memcapacitor 306 and other circuitry 316 are configured to define and oscillator. It is further assumed that such oscillator operates at a resonant frequency of three gigahertz.

At 402, a programming voltage is applied to the memcapacitor plates. For purposes of the ongoing illustration, it is assumed that operation of the oscillator is ceased temporarily, and a programming voltage pulse is applied to nodes 312 and 314 of the memcapacitor 306. As a result, mobile dopants are migrated within a dielectric layer (e.g., 106, 206) and the capacitive value of the memcapacitor is adjusted accordingly.

At 404, the oscillator is operated at the new resonant frequency. For purposes of the ongoing illustration, it is assumed that application of the programming voltage is ended, and oscillator operation is resumed at the new resonant frequency. It is further assumed that the oscillator defined by the inductor 302, the memcapacitor 306 and the other circuitry 316 operates at a new resonant frequency of three-point-two gigahertz.

Second Illustrative Circuit

Figure 5:
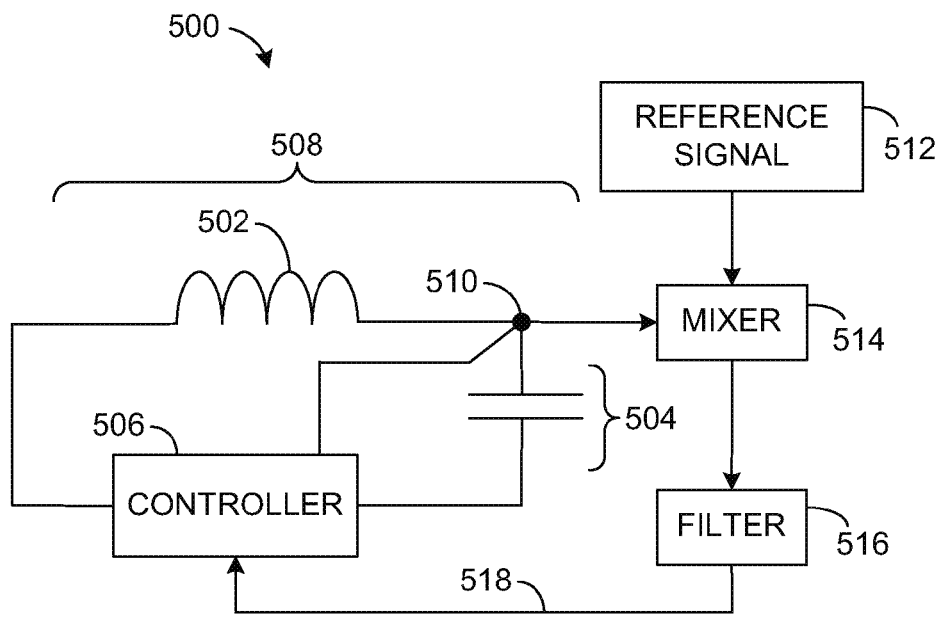
FIG. 5 is schematic block diagram of a circuit according to one embodiment.

FIG. 5 depicts a schematic block diagram of a circuit 500 according to another embodiment. The circuit 500 is illustrative and non-limiting with respect to the present teachings. Other circuits are also contemplated by the present teachings. The circuit 500 includes an inductor 502 and a memcapacitor 504. The inductor 502 and the memcapacitor 504 can be defined by any inductor and memcapacitor, respectively, consistent with the present teachings (e.g., inductor 114, 214; memcapacitor 118, 218; etc.).

The circuit 500 also includes a controller 506. The controller 506 is electrically coupled to the inductor 502 and the memcapacitor 504 such that an oscillator 508 including a resonant tank circuit is defined. The controller 506 is defined by, or can include, any suitable circuitry or resources as required or desired. In one embodiment, the controller 506 includes a microprocessor or microcontroller configured to operate in accordance with a stored program code. Other resources can also be used. Furthermore, the controller 506 is configured to control the application of a programming voltage to the memcapacitor 504 by way of a node 510. In this way, the controller 506 can shift the capacitance value of the memcapacitor 504 as described above.

The circuitry 500 also includes a reference signal source (or generator) 512. The reference signal source 512 provides a reference signal at one or more predetermined frequencies. In one embodiment, the reference signal source 512 is defined by or includes a crystal oscillator. Other reference signal sources can also be used.

The circuitry 500 also includes a mixer 514. The mixer 514 is configured to mix an output signal (i.e., frequency) from the oscillator 508 at node 510 with an output from the reference signal source 512. The mixer 514 then provides output including sum and difference signals.

The circuitry 500 further includes a filter 516. The filter 516 is a low-pass type, as is familiar to one having ordinary skill in the electrical arts. The filter 516 extracts a direct-current or low frequency signal (referred to hereinafter as a DC signal) from the output of the mixer 514 and provides that DC signal at a node 518. The DC signal at node 518 is proportional to the phase difference between the oscillator 508 signal and the reference signal 512 and operates as negative feedback to the controller 506. Thus, when the oscillator 508 and reference source 512 signals are phase-matched (i.e., phase locked, or frequency synchronized), the DC signal at node 518 is a nullity. Further operation of the circuit 500 is described hereinafter with respect to the method of FIG. 6.

The circuitry 500 operates as a self-tuning oscillator or phase-locked loop (PLL). Such circuitry 500 can be part of, for non-limiting example, a wireless network device, a cellular telephone, a two-way radio transceiver, a radio frequency identification device (RFID), a portable wireless Internet access device, etc. Other devices using the circuitry 500 can also be configured and operated.

Second Illustrative Method

Figure 6:
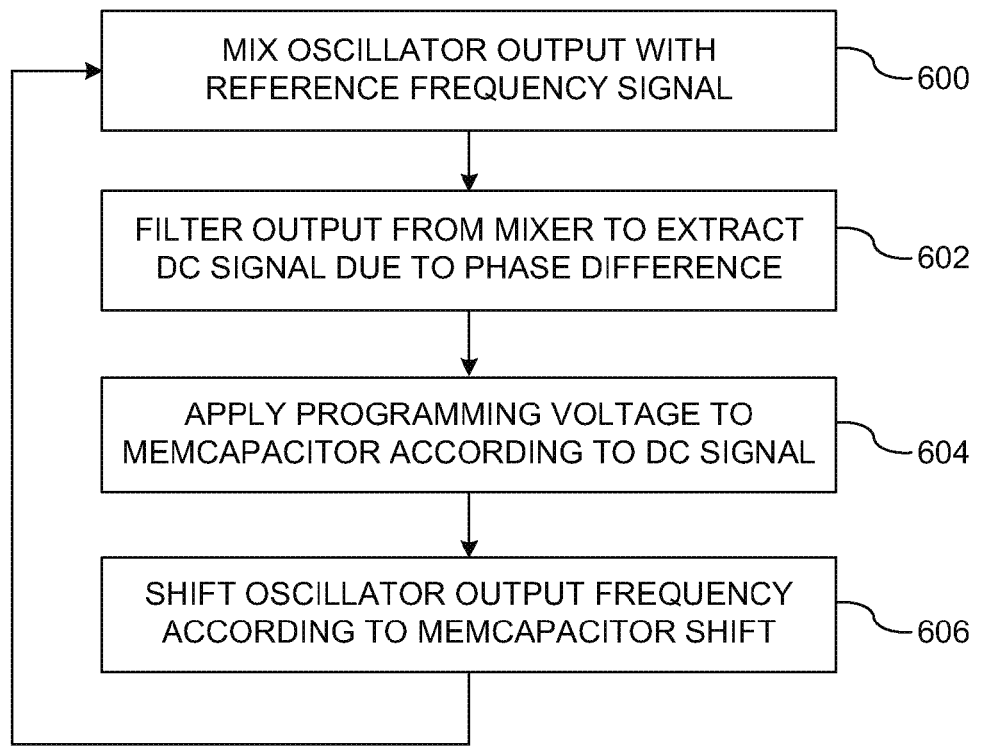
FIG. 6 is a flow diagram of a method according to one embodiment.

Attention is now directed to FIG. 6, which depicts a method according to one embodiment of the present teachings. The method of FIG. 6 depicts particular method steps and an order of execution. However, it is to be understood that other methods including other steps, omitting one or more of the depicted steps, or proceeding in other orders of execution are also contemplated. Thus, the method of FIG. 6 is illustrative and non-limiting with respect to the present teachings. Reference is made to FIG. 5 in the interest of understanding the method of FIG. 5.

At 600, an output signal from an oscillator is mixed with a reference frequency signal. For purposes of non-limiting illustration, it is assumed that an output signal from the oscillator 508 is mixed with a reference frequency provided by the source 512 using the mixer 514.

At 602, output signal content from the mixer is filtered to extract a DC signal. For purposes of the ongoing example, it is assumed that output from the mixer 514 is filtered by the low-pass filter 516 so as to extract a DC signal. The DC signal corresponds to the phase difference between the oscillator 508 signal and the reference frequency signal 512.

At 604, a programming voltage is applied to a memcapacitor in accordance with the DC signal. For purposes of the ongoing example, it is assumed that the controller 506 derives a programming voltage in accordance with the DC signal from the filter 516. The programming voltage is applied across the memcapacitor 504 and causes the memcapacitor 504 capacitance value to shift accordingly.

At 606, the output signal from the oscillator shifts in frequency in accordance with a shift in capacitance value of the memcapacitor. For purposes of the ongoing example, it is assumed that the oscillator 508 frequency is shifted toward that of the reference signal source 512. The method then returns to step 600 above.

The method of FIG. 6 is depicted and described in a discrete and step-wise flow in the interest of clarity. However, it is to be understood that the method of FIG. 6 can be, and typically is, performed in a rapid and essentially simultaneous manner (e.g., by way of circuitry 500, etc.). In this way, the frequency output from an oscillator can be automatically error-corrected by virtue of negative feedback. During those times that the DC signal is a nullity, no shift in the memcapacitor value is performed and the oscillator continues to operate at its present frequency.

In general, the foregoing description is intended to be illustrative and not restrictive. Many embodiments and applications other than the examples provided would be apparent to those of skill in the art upon reading the above description. The scope of the invention should be determined, not with reference to the above description, but should instead be determined with reference to the appended claims, along with the full scope of equivalents to which such claims are entitled. It is anticipated and intended that future developments will occur in the arts discussed herein, and that the disclosed systems and methods will be incorporated into such future embodiments. In sum, it should be understood that the invention is capable of modification and variation and is limited only by the following claims.

What is claimed is:

1. An apparatus, comprising:
   a ground plane defining a first capacitive plate;
   a dielectric layer overlying the ground plane;
   a mobile dopant repositionable within the dielectric layer under the influence of an electric field; and
   a metallic layer overlying the dielectric layer and configured to define a second capacitive plate and an inductor, the first capacitive plate and the second capacitive plate and the dielectric layer being respective portions of a capacitor;
   the capacitor and the inductor being respective components of a variable-frequency oscillator.

2. The apparatus according to claim 1, further comprising a donor layer adjacent to the dielectric layer, said donor layer providing the mobile dopant to said dielectric layer to adjust a capacitance value of said capacitor.

3. The apparatus according to claim 2, wherein said second capacitive plate is disposed over said donor layer and said inductor is disposed on said dielectric layer laterally to said second capacitive plate and donor layer.

4. The apparatus according to claim 1, the metallic layer further configured such that the inductor is in the form of a spiral.

5. The apparatus according to claim 1 further configured such that:

the mobile dopant migrates within the dielectric layer so as to increase a capacitance value of the capacitor in response to first programming voltage applied to the capacitor; and
the mobile dopant migrates within the dielectric layer so as to decrease the capacitance value of the capacitor in response to a second programming voltage applied to the capacitor.

6. The apparatus according to claim 1, the dielectric layer including at least one of silicon, high-resistivity silicon, gallium nitride, strontium titanium trioxide, zirconium dioxide, hafnium dioxide, copper chloride, or titanium dioxide.

7. The apparatus according to claim 1, the mobile dopant including at least oxygen vacancies, nitrogen vacancies, chlorine vacancies, sulfide ions, silver ions, or lithium ions.

8. The apparatus according to claim 1 further comprising a donor layer disposed between the dielectric layer and the second capacitive plate, the donor layer configured to donate the mobile dopant to the dielectric layer in response to a first programming voltage applied to the capacitor, the donor layer further configured to receive the mobile dopant from the dielectric layer in response to a second programming voltage applied to the capacitor.

9. An electronic circuit, comprising:
   a memcapacitor characterized by a non-volatile capacitance value adjustable in response to a programming voltage, the memcapacitor including a capacitive plate; and
   an inductor electrically coupled to the memcapacitor, the capacitive plate and the inductor being respective portions of a continuous electrically conductive mass.

10. The electronic circuit according to claim 9, the continuous electrically conductive mass including at least aluminum, platinum, copper, gold or silver.

11. The electronic circuit according to claim 9, the electronic circuit defining a self-tuning oscillator, the memcapacitor and the inductor being electrically coupled to define a resonant tank circuit of the self-tuning oscillator.

12. The electronic circuit according to claim 9, the memcapacitor further including a dielectric and mobile dopant, the mobile dopant being migratory within the dielectric in response to the programming voltage.

13. A method, comprising:
    applying a programming voltage to a memcapacitor which is connected to an inductor to form a resonant circuit;
    adjusting a capacitance value of the memcapacitor in response to the applied programming voltage; and
    operating the resonant circuit including the memcapacitor at a new resonant frequency distinct from a previous resonant frequency by virtue of the adjusted capacitance value.

14. The method according to claim 13 further comprising repositioning mobile dopants within a dielectric of the memcapacitor in response to the applying the programming voltage.

15. The method according to claim 14 further comprising donating the mobile dopants from or receiving the mobile dopants into a layer of donor material in response to the applying the programming voltage.

16. The method according to claim 13 further comprising:
    mixing the previous resonant frequency with a reference frequency; and
    deriving the programming voltage in response to the mixing.

17. The electronic circuit according to claim 9, further comprising:

a donor layer adjacent to a dielectric layer of said memcapacitor, said donor layer providing a dopant to said dielectric layer to adjust a capacitance value of said memcapacitor.

18. The electronic circuit according to claim 17, wherein said capacitive plate is disposed over said donor layer and said inductor is disposed on said dielectric layer laterally to said capacitive plate and donor layer.

19. The electronic circuit according to claim 9, wherein said inductor is in the form of a spiral around the capacitive plate.

20. The electronic circuit according to claim 9, the memcapacitor and the inductor being respective components of a variable-frequency oscillator.

\* \* \* \* \*